United States Patent [19]
Van Hunsel et al.

[11] Patent Number: 5,932,394
[45] Date of Patent: *Aug. 3, 1999

[54] PRODUCING A LITHOGRAPHIC PRINTING PLATE BY SEQUENTIALLY EXPOSING A THERMO-SENSITIVE IMAGING ELEMENT BY A SET OF RADIATION BEAMS

[75] Inventors: Johan Hubert Van Hunsel, Hasselt; Jacobus Herman Bosschaerts, Mortsel; Joan Triphon Vermeersch, Deinze; Robert Theodoor Overmeer, Mortsel, all of Belgium; Fred William Marland, N.Billerica, Mass.

[73] Assignee: Agfa-Gevaert N.V., Mortsel, Belgium

[*] Notice: This patent is subject to a terminal disclaimer.

[21] Appl. No.: 08/812,448

[22] Filed: Mar. 6, 1997

Related U.S. Application Data

[60] Provisional application No. 60/015,678, Apr. 17, 1996.

[30] Foreign Application Priority Data

Mar. 14, 1996 [EP] European Pat. Off. .............. 96200689

[51] Int. Cl.⁶ ...................................................... G03C 5/00
[52] U.S. Cl. ............................ 430/302; 430/30; 430/348; 430/394; 430/494; 430/944; 430/945
[58] Field of Search ............................. 430/30, 302, 348, 430/349, 394, 494, 944, 945

[56] References Cited

U.S. PATENT DOCUMENTS

| | | | |
|---|---|---|---|
| 4,383,261 | 5/1983 | Goldberg | 346/1.1 |
| 5,804,355 | 9/1998 | Bosschaerts et al. | 430/346 |

*Primary Examiner*—Bernard Codd
*Attorney, Agent, or Firm*—Baker & Botts, L.L.P.

[57] ABSTRACT

A method for generating on a lithographic printing plate a screened reproduction of a contone image, comprising the steps of: (1) transporting a thermo-sensitive imaging element through an exposure area; (2) scanwise exposing the thermo-sensitive imaging element according to screened data representative for tones of a contone image with a set (s) of radiation beams (b) as the thermo-sensitive imaging element is transported through the exposure area, characterized in that at any given moment (ta+Δt) during the exposure at least two radiation beams (bi,bj) of the set of radiation beams impinge on different microdots (ma, ma+Δm) of a scanline (1a) on the imaging element, so that by completion of the exposure step each effective microdot of the scanline has been impinged by all effective radiation beams of the set.

9 Claims, 7 Drawing Sheets

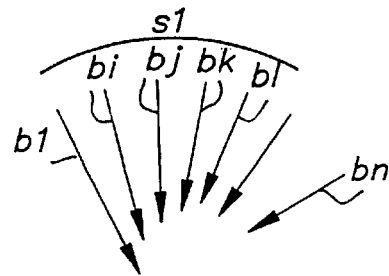
FIG. 6.1
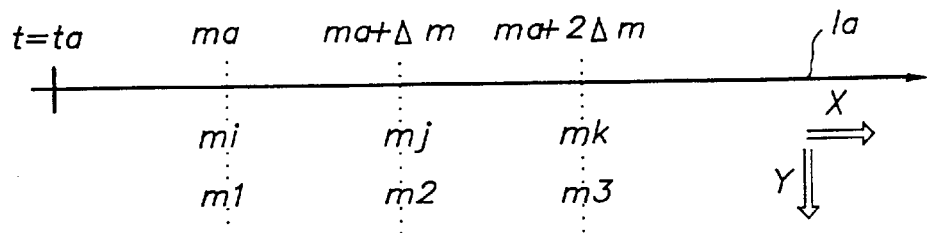
FIG. 6.2
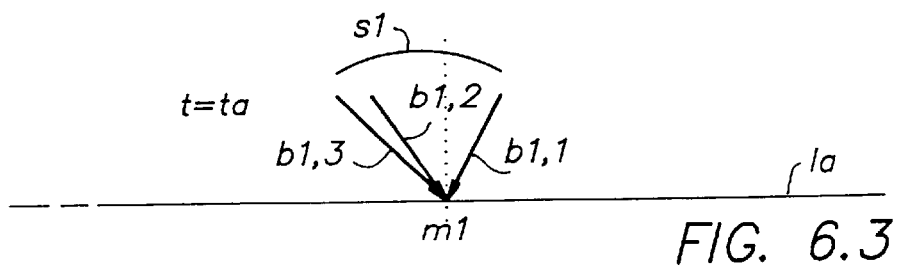
FIG. 6.3
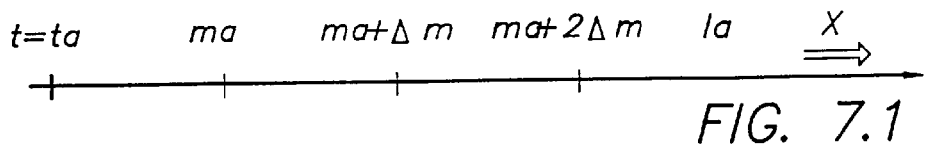
FIG. 7.1
FIG. 7.2
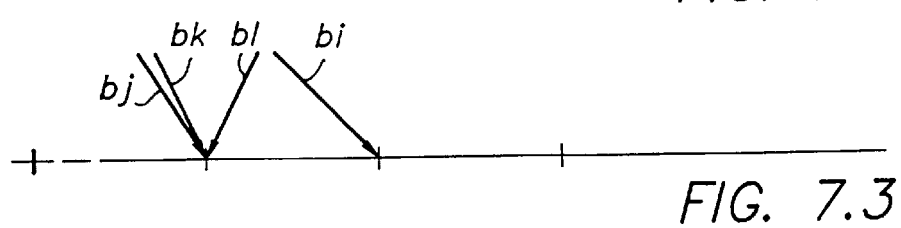
FIG. 7.3
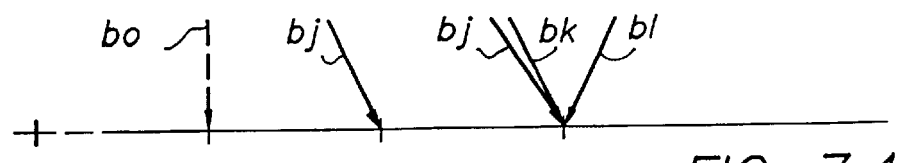
FIG. 7.4

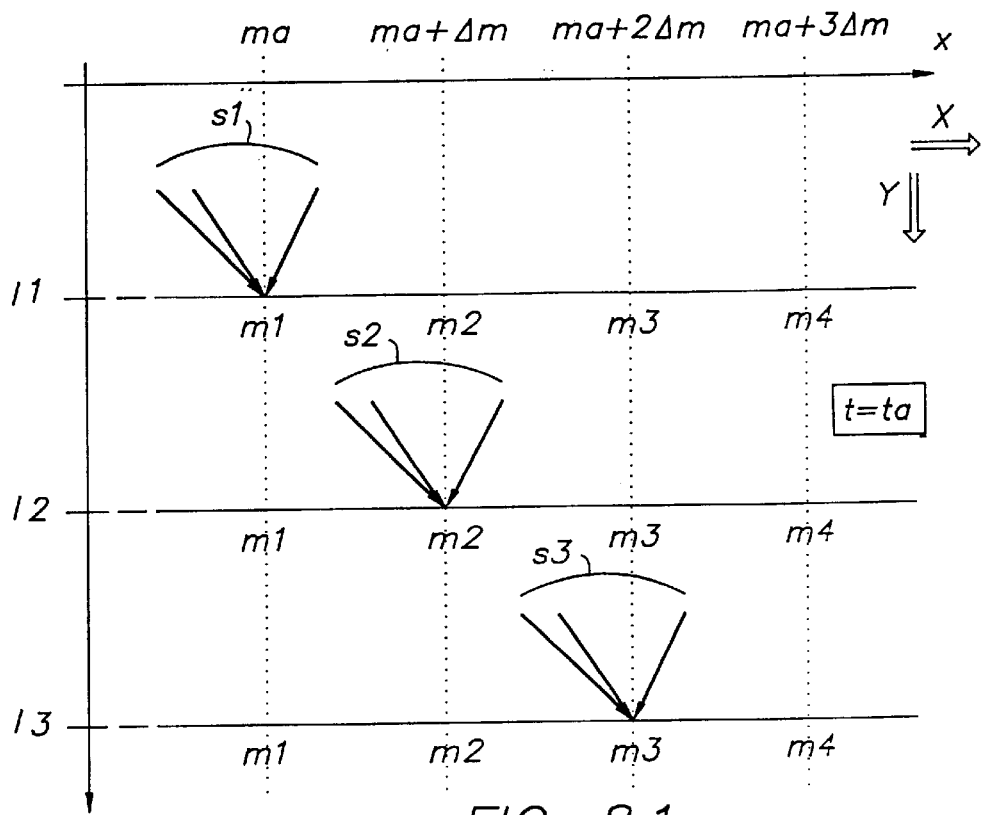
FIG. 8.1
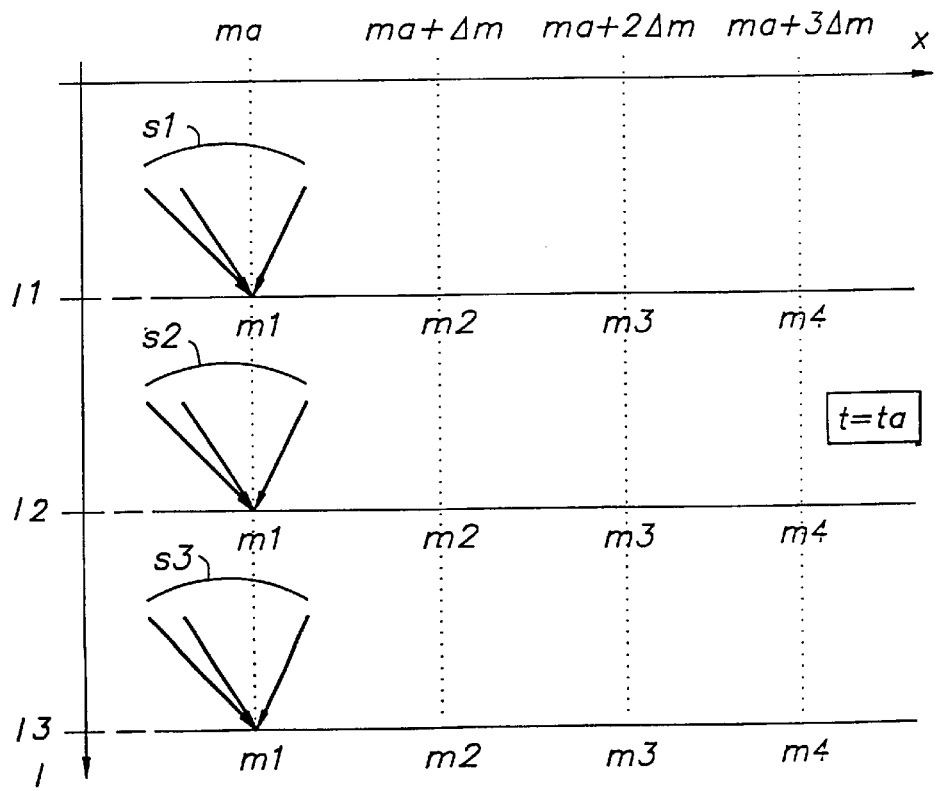
FIG. 8.2

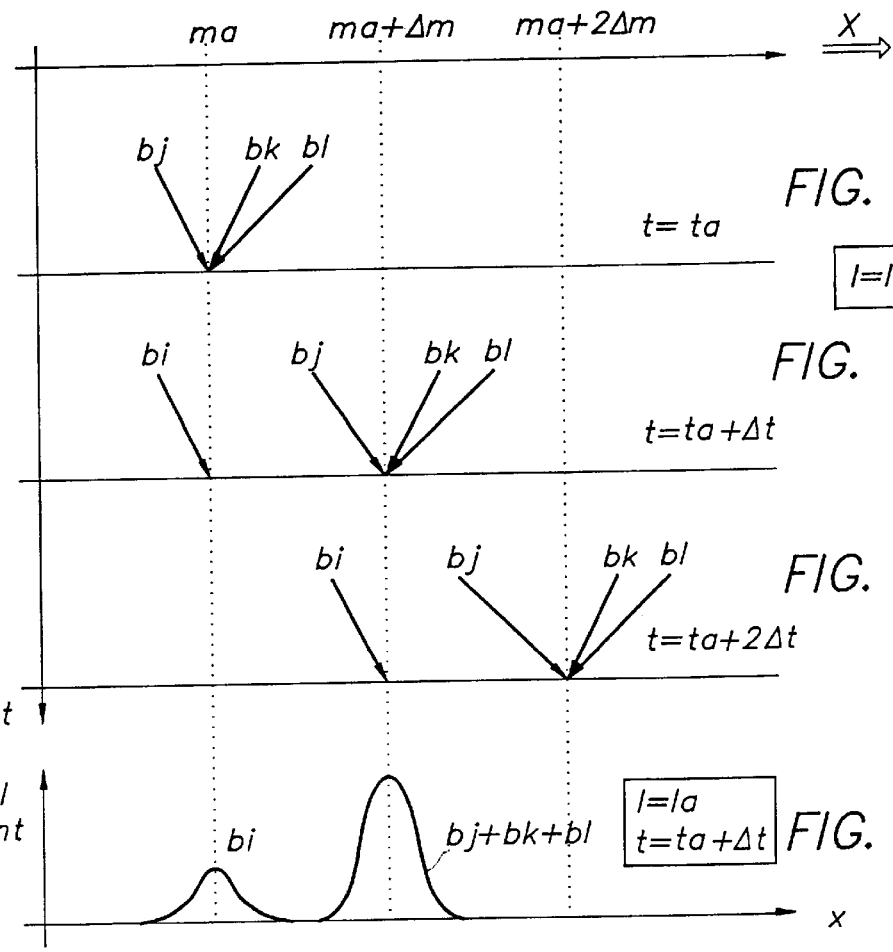
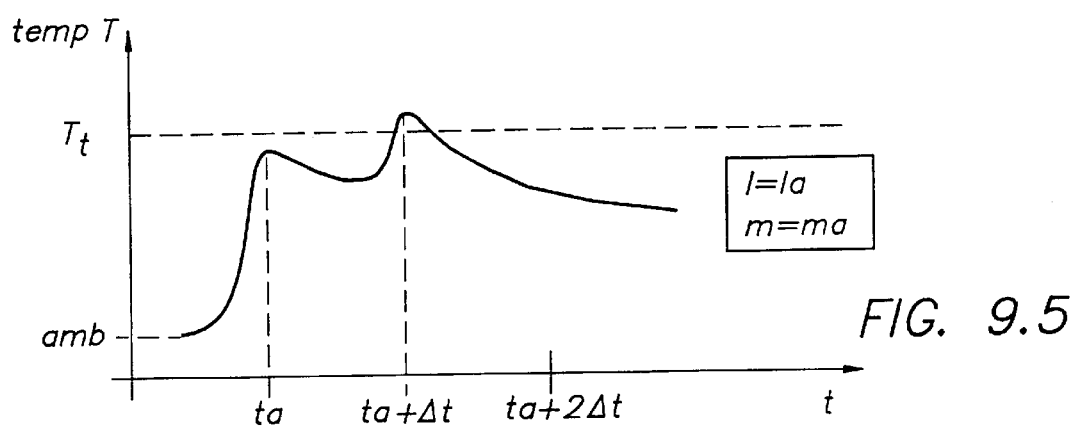
FIG. 9

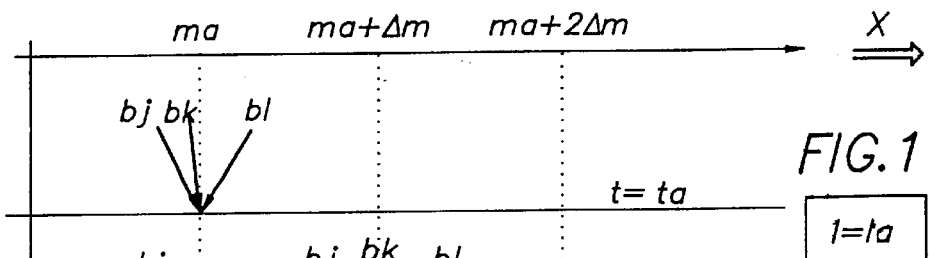
FIG.11.1
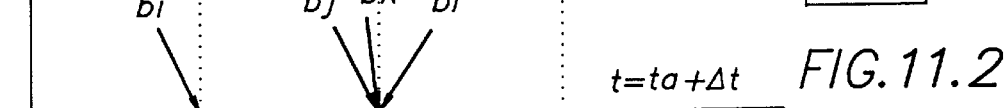
FIG.11.2
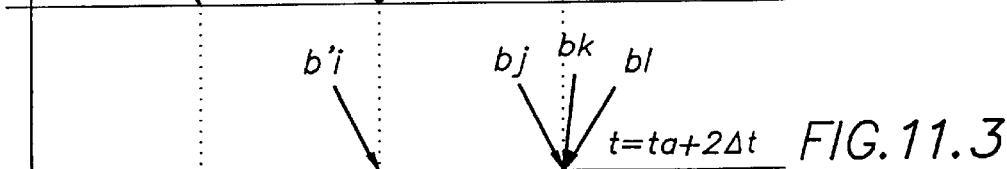
FIG.11.3
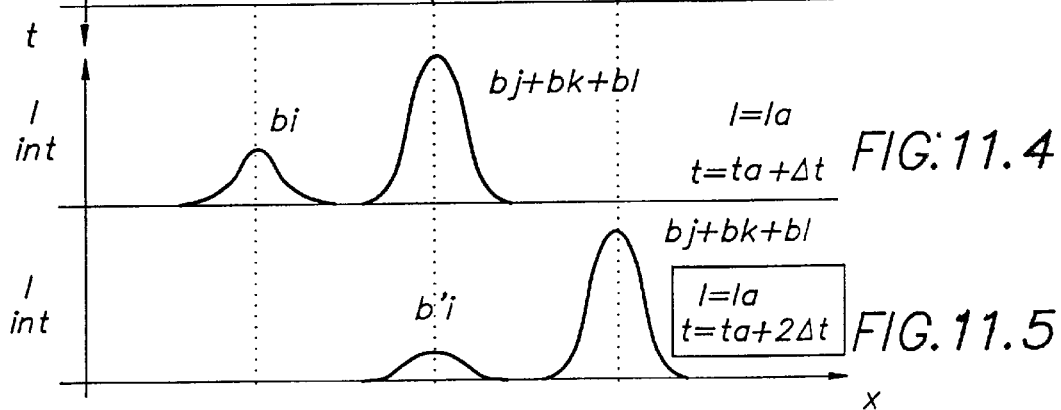
FIG.11.4
FIG.11.5
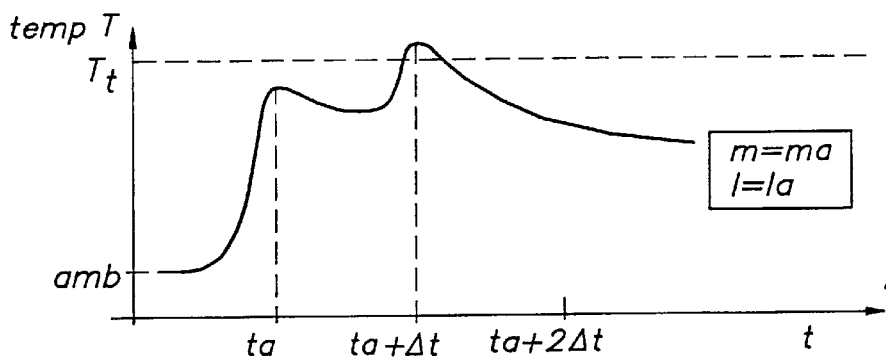
FIG.11.6
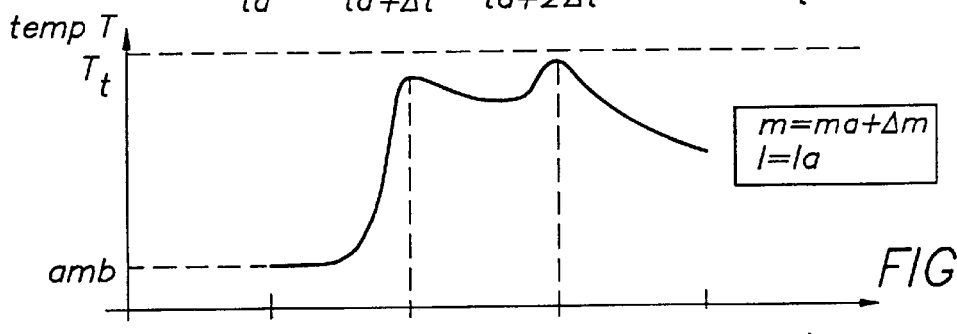
FIG.11.7
FIG. 11

PRODUCING A LITHOGRAPHIC PRINTING PLATE BY SEQUENTIALLY EXPOSING A THERMO-SENSITIVE IMAGING ELEMENT BY A SET OF RADIATION BEAMS

The application claims the benefit of the U.S. Provisional Application No. 60/015,678, filed Apr. 17, 1996.

FIELD OF THE INVENTION

The present invention relates to a method for generating a screened reproduction of a contone image by means of an electronic screening modulation of the original. More particularly the invention relates to a method wherein a lithographic printing plate precursor is scanwise exposed and optionally developed according to a thermal recording process.

BACKGROUND OF THE INVENTION

Lithographic printing is the process of printing from specially prepared surfaces, some areas of which are capable of accepting ink, whereas other areas will not accept ink.

In the art of photolithography, a photographic material is made imagewise receptive to oily or greasy ink in the photo-exposed areas (negative working material) or in the non-exposed areas (positive working material) on an ink-repelling background.

Nowadays methods are known for making printing plates involving the use of imaging elements that are thermo-sensitive rather than photo-sensitive. A particular disadvantage of photo-sensitive imaging elements (such as described above) for making a printing plate is that they have to be shielded from daylight and need special handling conditions, e.g. so-called darkroom conditions. Furthermore, it is claimed that thermal plates have a higher resolution and higher tone range capabilities. The trend towards thermo-sensitive printing plate precursors is clear when observing present evolutions of the market (cfr. "Jetzt kommt die Thermoplatte in die Praxis: Startschuβ für Computer-to-plate ist gefallen", in Deutscher Drucker, 32. Jahr, Nr. 24, Jun. 27, 1996, pp. g14–g15).

For example, EP-A 95.202.871.0, 95.202.872.8, 95.202.873.6 and 95.202.874.4 (all in the name of Agfa-Gevaert N. V.) disclose a method for making a lithographic printing plate comprising the steps of (1) image-wise exposing to light a thermo-sensitive imaging element comprising (i) on a hydrophillic surface of a lithographic base an image forming layer comprising hydrophobic thermoplastic polymer particles dispersed in a hydrophillic binder and (ii) a compound capable of converting light to heat, said compound being comprised in said image forming layer or a layer adjacent thereto; (2) and developing a thus obtained image-wise exposed element by rinsing it with plain water.

However, it is known that during the exposure of such imaging elements partial or total ablation may occur in at least the surface layer of these imaging elements. This may result in a deterioration of the lithographic properties of a so obtained lithographic plate, e.g. a decreased ink accepting behaviour of said ablated areas.

These ablation phenomena especially occur at a higher recording (or scanning) speed, or at a lower "recording time per microdot", further abbreviated as $t_p$. Because of economical reasons, as a higher throughput means a higher productivity, there is a strong interest in the industry to increase the recording speeds, especially when using so-called "internal drum" or "flatbed" recording architectures. Now, for a given thermo-sensitive printing plate precursor, like those indicated in the previous paragraph, unwanted ablation or other unwanted side-reactions will occur when a given recording speed limit is surpassed. Due to the fact that a higher speed inherently requires a higher recording power (because only a smaller recording time per microdot is available for putting in a same energy) and due to the fact that a said printing plate precursor also shows a lower sensitivity at a lower recording time per microdot (called "sensitivity ir-reciprocity"), the required power when increasing the recording speed will become too high at a given speed for the imaging element to accommodate properly (wanted reaction) the heat/temperature build-up that goes with it. Then, a local burning or ablation or possibly another unwanted side-reaction takes place, which may cause a lowered "lithographic performance" (e.g. unwanted ink-uptake).

Now, a solution from the side of the imaging element has been proposed in EP-A-96.201.754.7 (in the name of Agfa-Gevaert N. V.).

This solution consists of using a specially designed top-coat layer which would reduce or prevent ablation or other unwanted side-reactions.

However, it would be more appropriate to have a hardware solution for this problem.

OBJECTS OF THE INVENTION

It is an object of the present invention to provide a method for making a lithographic printing plate according to a thermal recording process from a thermo-sensitive printing plate precursor.

More particularly, it is an object of the present invention to provide a method suitable for increased recording powers and speeds, without the occurrence of any unwanted side-reactions that impact the lithographic performance of said plate.

Further objects of the present invention will become clear from the description hereafter.

SUMMARY OF THE INVENTION

According to the present invention, there is provided a method for generating on a lithographic printing plate a screened reproduction of a contone image, comprising the steps of: (1) transporting a thermo-sensitive imaging element through an exposure area; (2) scanwise exposing said thermo-sensitive imaging element according to screened data representative for tones of a contone image with a set (s) of radiation beams (b) as said thermo-sensitive imaging element is transported through said exposure area, characterised in that at any given moment (ta) during said exposure at least two radiation beams (bi,bj) of said set (s) of radiation beams impinge on different microdots (mi,mj) of a scanline (1a) on said imaging element, so that by completion of the exposure step each effective microdot (which is a microdot corresponding to a lithographic effective change) of said scanline has been impinged by all effective radiation beams (which are radiation beams needed to obtain a lithographic effective change) of said set.

BRIEF DESCRIPTION OF THE DRAWINGS

The present invention is illustrated by the way of example and without an Intention to limit the invention thereto with the following drawings:

FIGS. 6.1 to 6.3 indicate a set of available radiation beams impinging on a microdot on a scanline;

FIGS. 7.1 to 7.4 indicate a set of effective radiation beams impinging on neighbouring microdots on a scanline 1a;

FIGS. 8.1 and 8.2 illustrate three sets of available radiation beams, each set impinging on a different or on a same microdot of different scanlines;

FIGS. 9.1 to 11.7 illustrate for some neighbouring microdots on a same scanline the consecutive impingement of a set of radiation beams according to the present invention, corresponding intensity or energy distribution curves, and corresponding temperature evolutions in the thermo-sensitive imaging elements.

DETAILED DESCRIPTION OF THE INVENTION

Figure 1:
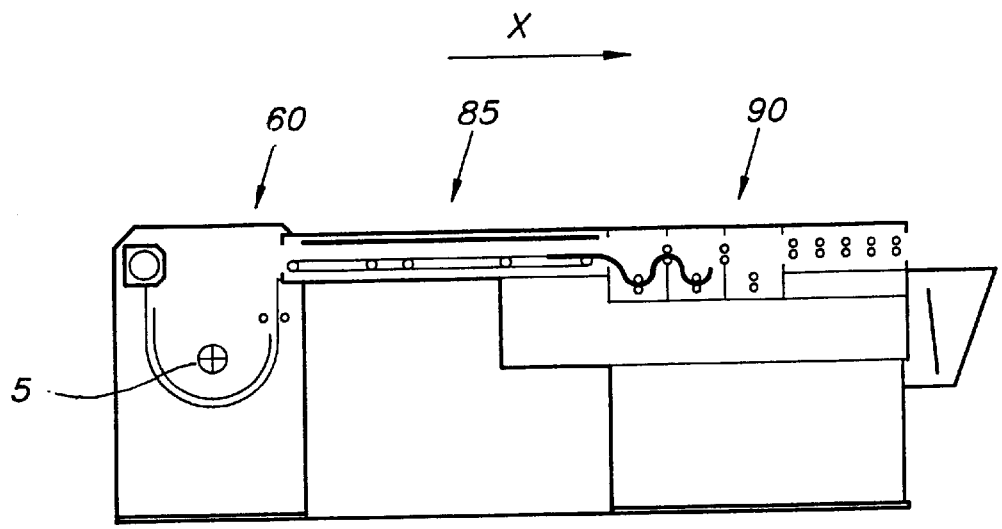
FIG. 1 is a longitudinal section of an imagesetter linked to a horizontal processor, suitable for use in a method according to the present invention.

The description given hereinafter mainly comprises five chapters, namely (i) terms and definitions used in the present application, (ii) preferred embodiments for making a lithographic printing plate according to the present invention, (iii) preferred embodiments for implementing a reproduction method according to the present invention, (iv) preferred embodiments for thermo-sensitive imaging elements suitable for use in a method according to the present invention, (v) further applications of the present invention.

(i) Explanation of terms used in the present description

As an aid to understanding the discussion that follows, the meaning of some specific terms applying to the specification and to the claims are explained.

Each "image", including as well an image resulting from scanning a hardcopy original as a so-called synthetic image_e.g. generated by a computer program_, is composed of a number of picture elements, shortly called "pixels or PEL's".

These pixels can be thought to be arranged on a grid. Usually, such a grid has a square structure; however, often a rectangular grid is used. Sometimes another kind of grid_e.g. hexagonal grid_ is used; optionally even a stochastic grid may be used.

The number of pixels in an image depends on the spatial resolutions along the directions of the sampling grid; e.g. in mainscan or fastscan direction X and in subscan or slowscan direction Y. In general, spatial resolution_expressed in dots per inch, shortly dpi_quantifies the spatial discretization of an image.

Tonal resolution is quantified by a value representative for the number of positive levels after the tonal quantization of a pixel.

A "contone or continuous tone image" is a representation of a spatial sampling of an original having a multiplicity of tone levels, and comprises information representative for optical density values_e.g. density, transmission, opacity_ of said original. This information is laid down in digital data, either explicitly (previously) generated or implicitly generated (on the fly). A contone image may comprise a matrix of elements; each element_often called PEL_can take C different contone values, wherein the number C of possible values must be greater than two (C>2; e.g. C=256).

In the present application, most of the described features are explicitly oriented towards a contone image, but they also explicitly or implicitly apply to a so-called "multiple tone or multitone image". By the term multitone image is meant an image with a rather moderate number of tone levels, comprising less tone levels than a contone image, but more than a halftone image.

Halftoning or screening is a technique in which an image with a first tonal resolution is transformed into an image with a second tonal resolution in such a way that (i) the second tonal resolution is lower than the first tonal resolution, and (ii) at least part of the tonal quantization error that is introduced by this process is spatially distributed.

A "halftone image" is the result of a halftoning process applied on a contone image and thus comprises a halftoned representation by digital data of a contone original. A halftone image may comprise a matrix of elements_each of which is often called "halftone element" or HEL_, wherein the number of possible values H of said elements is lower than the corresponding number of contone levels C (so H<C).

Generally, a halftoning technique converts a contone value into a geometric distribution of binary halftone dots that can be reproduced. Two main classes of halftoning techniques have been described for use in the graphic arts field. These two techniques are known as "amplitude modulation screening" or "dot size modulation screening" (abbreviated as AM) and "frequency modulation screening" or "stochastic screening" (abbreviated as FM). For a quick insight in the principal differences between AM and FM, reference is made to e.g. EP-A-96.200.689.6 (in the name of Agfa-Gevaert N. V.) for illustrations of corresponding arrangements of respectively clustered microdots (in case of AM) and of dispersed microdots (in case of FM).

In order to obtain a better reproduction result, various ameliorated screening techniques are suitable. Some improved screening techniques have already been described extensively in an earlier patent application EP-A-0 717 321 (in the name of Agfa-Gevaert N. V.), so that in the present description no explicit and extensive replication is necessary.

Schemes and descriptions of electronic circuits for implementing respectively FM- or AM-screening may be found in former applications as e.g. EP-A-95.200.713.6 (Agfa-Gevaert N. V.) for FM, and EP-A-95.203.148.2 (Agfa-Gevaert N. V.) for AM.

A tone value on a tone scale or grey scale relates to a degree or percentage of "coverage", sometimes also called "percentage value" or "occupied capacity"; e.g. a coverage of 50%.

A "micro dot" or "elementary dot" or "recorder element"_generally abbreviated as "REL or rel"_is the smallest spatially addressable unit on a recording device or the smallest space on an imaging element that can get an optical density or an ink repellency/acceptance, different from neighbouring locations. A rel can have any form, as e.g. rectangular or hexagonal, or circular, or square.

In connection with thermo-sensitive materials which were subjected to a process comprising a screening of an original, a modulated "halftone dot" is the smallest image unit that is rendered on said thermo-sensitive material after exposing and processing said material. The size of a halftone dot can be equal to the size of a rel or may comprise several rels. A halftone dot can have any form, but usually its shape is square or rectangular. Two halftone dots with successive tone values, just differ by one singular microdot or rel.

As to the exposure of a REL on an imaging element, the present application makes a distinction between potentially "available radiation beams" and effectively active radiation beams, further called "effective or active radiation beams". An available beam is only called "effective or active" if said beam really impinges on a imaging element in order to provide a lithographic effective change on said imaging element. The important distinction between these terms will become more clear later on (while explaining FIG. 7.4).

Thus really activated microdots correspond to a density different from zero or to a lithographic effective change and will be called "effective microdots".

Although in many publications often the wordings "scanning" and "recording" may be nearly synonyms, in other circumstances they really do differ in meaning.

The present specification uses the wording "scanning" when it refers (i) to capturing an input of data while reading an original, or (ii) to a linewise and pixelwise progressing movement (also called "sweeping") of a reading or writing spot (in opposite to e.g. a simultaneous, parallel exposure of all effective pixels by means of a CRT-screen, a LCD-screen, a LED-array). Dedicated examples comprise: "scanning an original, scanning exposure, scanning direction, scanwise exposing fast-scan-speed, . . . "

The present specification uses the wording "recording" when it refers to driving an output of data as in writing (e.g. by heating) a printing plate precursor. Dedicated examples comprise: "thermal recording process, recording element, recording layer, recording power, . . . "

Yet, it may be clear that a recording process may comprise a scanning exposure. Other examples of equivalent expressions comprise: "recording (or scanning) device, recording (or scanning) speeds, scanline or exposure line, . . . "

The wordings "recording time per microdot" or "working REL exposure time" or "REL dwell time" or the abbreviation "REL-time", are understood as being equivalent. It may be remarked that in many publications, often the wording "pixel time" is used; but in the present application, the term pixel is directed to a contone original image, whereas the term REL is directed to a halftone image. This REL-time ($t_p$) can be calculated by dividing the fast-scan-dimension of a microdot (e.g. the diameter $\phi$ if the spot is circular, or an equivalent diameter $\phi$ if the spot is elliptic, rectangular, square . . . ) by the fast-scan-speed ($V_f$).

Hence, $$t_p = \phi : V_f \quad [1]$$

Following terms are meant to be (nearly) synonyms: thermo-sensitive, or thermosensitive, or heat-sensitive; thermal recording or thermo-recording . . .

As still other important terms may appear in the following description, said terms will be explained at their first introduction.

(ii) Preferred embodiments for making a lithographic printing plate according to the present invention Imagewise exposure in accordance with the present invention proceeds by a scanwise exposure by means of e.g. a laser according to said screened data preferably directly on the printing plate precursor, which is generally known as "computer-to-plate".

A "computer-to-plate" method can be carried out with the aid of different types of recording devices, e.g. a capstan type recording device (as e.g. AGFA ACCUSET 1500™), a flat bed type recording device (as e.g. BARCO LITHOSETTER V™), an internal drum type recording device (as e.g. AGFA SELECTSET AVANTRA 44™ or GERBER CRESCENT C 42 T™), or optionally also an external drum type recording device (as e.g. CREO 3244 T™). An extended description of such recording devices can be found e.g. in the above-mentioned EP-A-95.200.713.6, so that in the present description any explicit and extensive replication is superfluous.

Most of the presently available computer-to-plate recorders are suitable for imaging photo-sensitive printing plate precursors. However, some computer-to-plate recorders also are available in a so-called thermal version.

Figure 2:
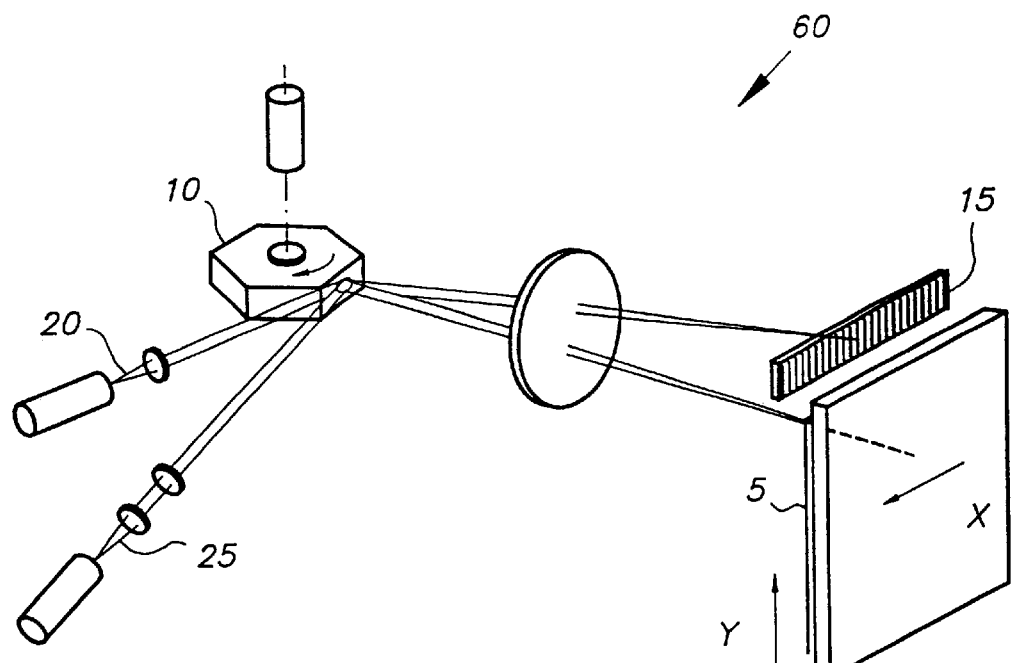
FIG. 2 schematically shows a flat bed type recording (or scanning) device for use in a method according to the present invention.
Figure 3:
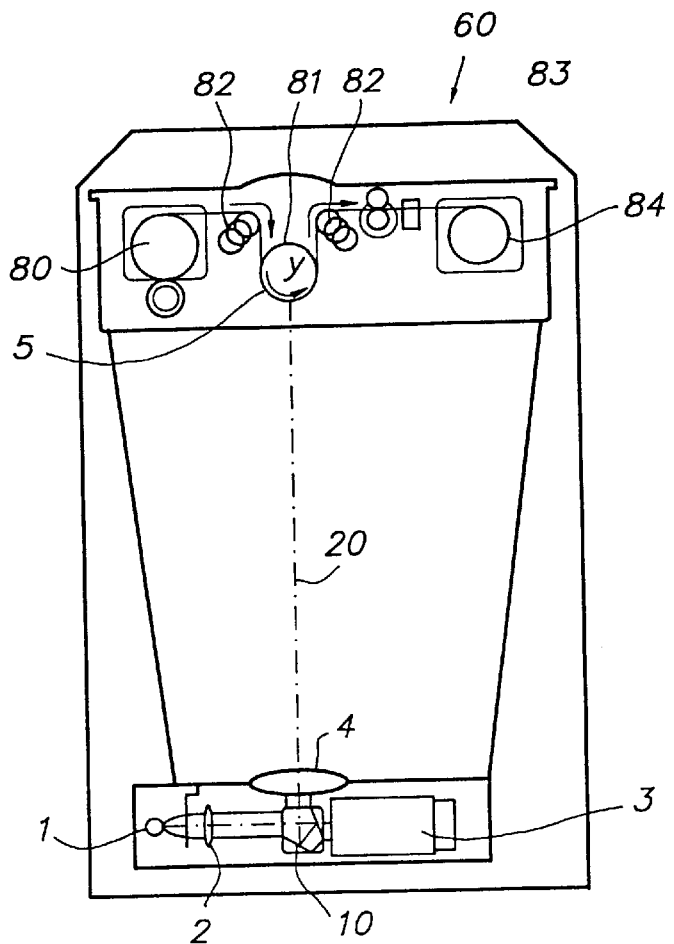
FIG. 3 shows a capstan type recording device for use in a method according to the present invention.
Figure 4:
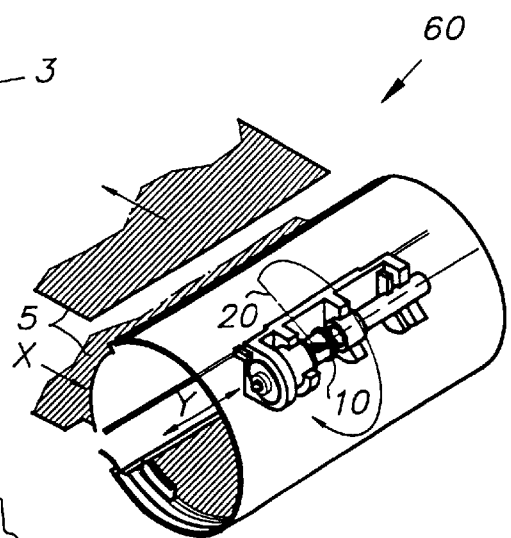
FIG. 4 schematically shows an internal drum type recording device for use in a method according to the present invention.
Figure 5:
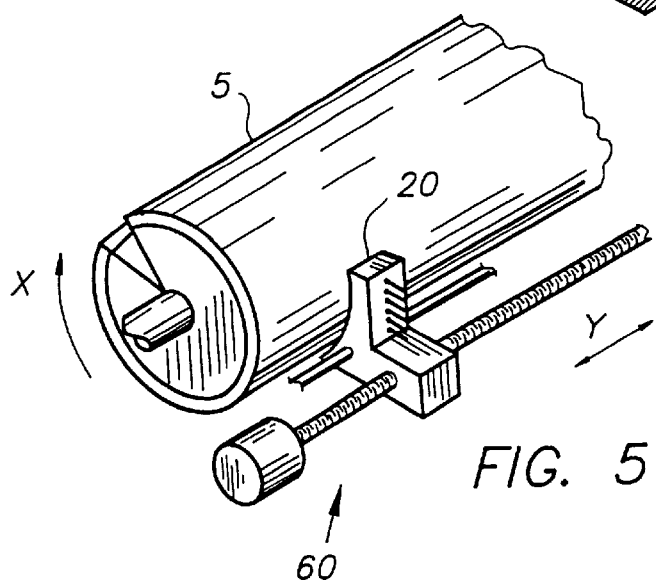
FIG. 5 schematically shows an external drum type recording device known in other recording systems.

In the following drawings, equivalent parts are designated by the like reference numerals. Herein, FIG. 2 schematically shows a flat bed type recording device suitable for use in a method according to the present invention. FIG. 3 shows a capstan type recording device for use in a method according to the present invention. FIG. 4 schematically shows an internal drum type recording device for use in a method according to the present invention. FIG. 5 schematically shows an external drum type recording device known in other recording systems.

In a flatbed platesetter (cfr. FIG. 2), the exposing step comprises generating a modulated writing radiation beam 20 having a wavelength to which an imaging element 5 is sensitive and directing a writing radiation beam 20 to a moving mirror 10 to cause the writing radiation beam 20 to scan across the surface of the imaging element 5 in a first scanning direction X. A reference radiation beam 25 is generated and directed to the moving mirror 10 simultaneously with the writing radiation beam 20 to cause the reference radiation beam 25 to scan across the surface of a radiation detecting element 15 in the first scanning direction X. Since the writing radiation beam 20 and the reference beam 25 are both deflected by the same moving mirror 10, the reference beam 25 falling on the radiation detecting element 15 causes the generation of synchronising signals indicative of the position of the writing radiation beam 20 on the surface of the imaging element 5. The writing radiation beam 20 is modulated and the imaging element 5 is moved in a second scanning direction Y in response to the synchronising signals generated by the radiation detecting element 15. In this manner any imperfections in the surface of the moving mirror 10, or in its movement, are accounted for.

The writing radiation beam 20 is modulated as the recording (or scanning) process proceeds, in order to informationwise expose the imaging element 5. The reference radiation beam 25 is not modulated, but is of constant intensity.

In the flatbed configuration, the beam is drawn across either axis of the imaging element, and is indexed along the other axis after each pass. Of course, the requisite relative motion between the beam and the imaging element may be produced by movement of the imaging element rather than (or in addition to) movement of the beam.

In a drum type recording device said reference beam is usually replaced by an encoding-and-decoding system. For sake of simplicity, in FIGS. 3, 4 and 5 no encoder has been illustrated.

In FIG. 3, showing a capstan type recording device suitable for use in a method according to the present invention, the optical system is illustrated beneath and comprises a radiation source (e.g. a laser diode) 1, a filter 2, a moving mirror (e.g. a rotating prism) 10, a spin motor 3 and a lens 4. The transport system is illustrated in the upper part of FIG. 3 and comprises a supply magazine 80, a capstan 81, tension rollers 82, optionally a cutter 83 and a take-up system 84.

In an external-drum configuration (cfr. FIG. 5), the requisite relative motion between the laser beam and the imaging element is achieved by rotating the drum(and the imaging element mounted thereon) about its axis and moving the beam parallel to the rotation axis, thereby scanning the imaging element circumferentially. It is said that the image "grows" in the axial direction.

Particularly in an external drum recorder, it is generally preferable_for reasons of speed_ to employ a plurality of lasers and guide their outputs to a single writing array. The writing array is then indexed, after completion of each pass across the imaging element, a distance determined by the number of beams emanating from the array, and by the desired resolution.

As the recording (or scanning) speeds of such external drum platesetters are rather moderate, and the corresponding REL-times thus are rather high, the present invention is not of highest importance (although applicable) to such devices. Whereas external drum platesetters have rather large REL-times between 0.1 and 20 $\mu$s, flat bed platesetters and internal drum platesetters have far shorter REL-times, laying in a range between 0.01 and 0.2 $\mu$s.

(iii) Preferred embodiments for implementing a reproduction method according to the present invention Attention is given now to several aspects of an exposure according to which a heat sensitized printing plate precursor is recorded in accordance with the present invention.

Image-wise exposure in connection with the present invention is preferably an image-wise scanning exposure involving the use of a laser or a laser-diode. It is highly preferred in connection with the present invention to use a laser emitting in the infrared (IR) and/or near-infrared, i.e. emitting in the wavelength range 700–1500 nm.

Suitable lasers include a Nd-YAG-laser (neodymium-yttrium-aluminium-garnet; 1064 nm) or a Nd-YLF laser (neodymium-yttrium-lathanum-fluoride; 1053 nm). Typical suitable laser diodes emit e.g. at 830 nm or at 860–870 nm.

An imaging apparatus suitable for image-wise scanning exposure in accordance with the present invention preferably includes a laser output that can be provided directly to the imaging elements surface via lenses or other beam-guiding components, or transmitted to the surface of a imaging element from a remotely sited laser using a fibre-optic cable. A controller and associated positioning hardware maintains the beam output at a precise orientation with respect to the imaging elements surface, scans the output over the surface, and activates the laser at positions adjacent selected points of the imaging element. The controller responds to incoming image signals corresponding to the original document and/or picture which is copied onto the imaging element to produce a precise negative or positive image of that original.

Figure 10:
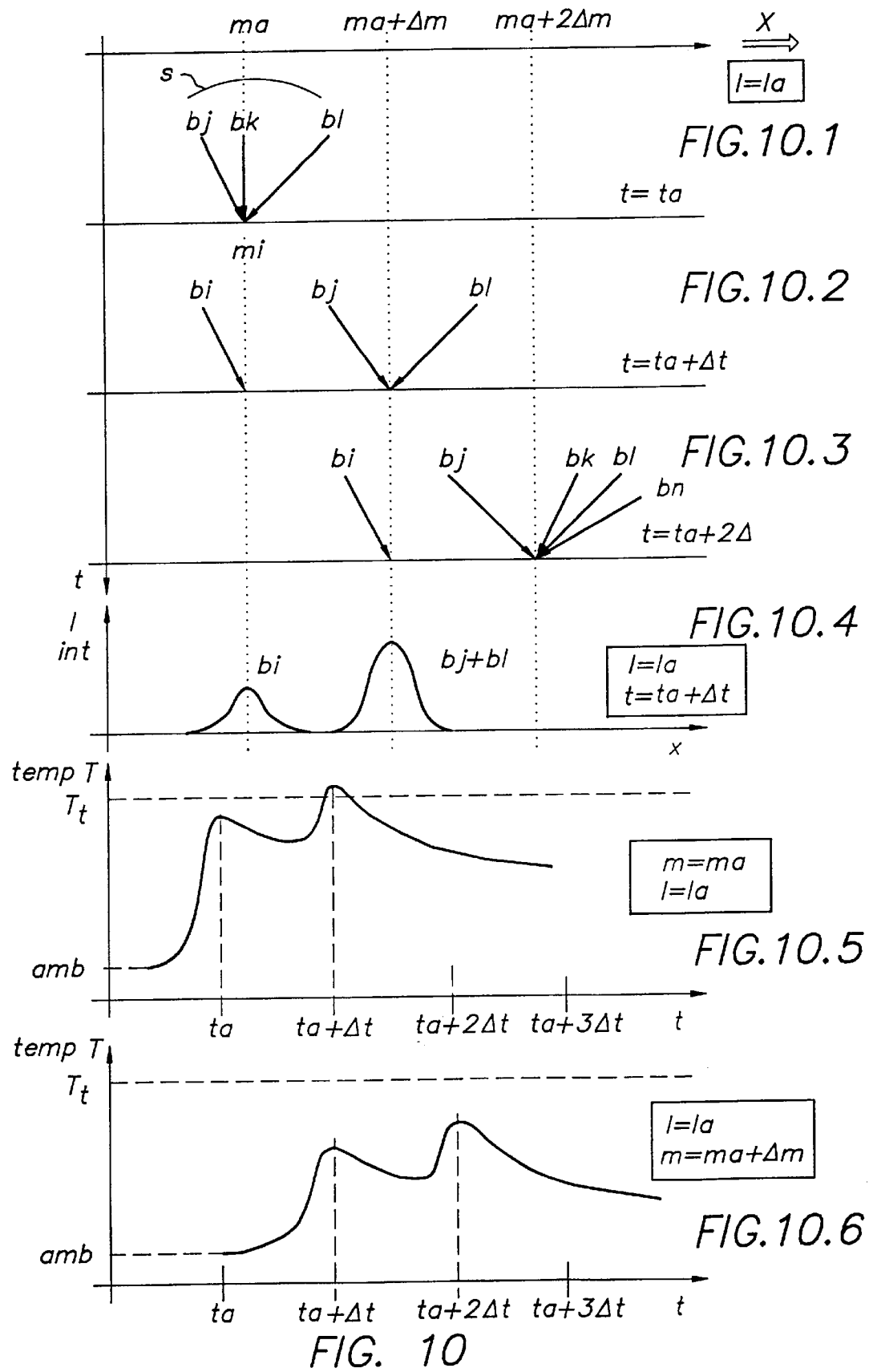

Before turning attention to detailed sketches and corresponding explanation of possible configurations of the radiation beams in a method according to the present invention (cfr. FIGS. 9–11, to be discussed later on), some introductory clarification about specific wordings and their meanings will be disclosed with reference to FIGS. 6.1 to 8.2.

FIG. 6.1 indicates a set or plurality s1 comprising several available radiation beams b (ranging from b1, over bi-,bj-bk-bl . . . to bn).

FIG. 6.2 indicates an arbitrary scanline 1a, comprising consecutive microdots m; for example ma, ma+$\Delta$m, ma+2$\Delta$m; or mi, mj, mk; or simply m1, m2, m3 . . . Symbol X indicates the fast-scan or main-scan direction; symbol Y indicates the slow-scan or sub-scan direction (cfr. also FIGS. 2, 4, 5).

FIG. 6.3 indicates a set s1 comprising available radiation beams bl,1–bl,2 and bl,3 impinging at moment ta on a microdot m1 on scanline 1a.

Whereas former drawings FIGS. 6.1–6.2 dealt with potentially "available radiation beams" (which will be called "effective" when really impinging on the imaging element), following drawings deal solely with "effective radiation beams." The thus really activated microdots correspond to a density different from zero or to a lithographic effective change and will be called "effective microdots".

FIGS. 7.1 to 7.4 indicate several different situations of a set comprising effective radiation beams impinging on neighbouring microdots on a scanline 1a. Contrary to FIGS. 9–11 (to be explained later on), these FIGS. 7.1–7.4 have no time relation, they merely represent different possible situations.

FIG. 7.1 indicates an arbitrary scanline 1a, comprising consecutive microdots ma, ma+$\Delta$m, ma+2$\Delta$m . . .

FIG. 7.2 indicates at a moment in time (ta) during exposure a set s comprising an effective radiation beam bj impinging on a microdot ma on scanline 1a and an effective radiation beam bk impinging on an immediate neighbouring microdot (ma+$\Delta$a) on same scanline 1a.

FIG. 7.3 indicates at a moment in time (ta) a set s comprising effective radiation beams bj–bl impinging on a microdot ma on scanline 1a and an effective radiation beam bi impinging on an immediate neighbouring microdot (ma+$\Delta$a) on same scanline 1a.

FIG. 7.4 indicates at a moment in time (ta) a set s comprising no effective radiation beams (didactically indicated by b0 and intentionally drawn with interrupted line-pieces) impinging on a microdot ma on scanline 1a, an effective radiation beam bi impinging on an immediate neighbouring microdot (ma+$\Delta$a) on same scanline 1a and effective radiation beams bj–bl impinging on a further neighbouring microdot (ma+2$\Delta$m) on same scanline 1a.

FIG. 8.1 illustrates a recording according to the present invention using at a moment in time (ta) at least two sets, e.g. three sets (s1–s3) of available radiation beams, each set impinging on a different microdot (respectively m1 to m3) of different scanlines (11 to 13). In relation to FIG. 8.1 it may be evident that consecutive sets do not need to impinge in a strictly consecutive order on consecutive microdots. For example, a recording wherein at a moment ta a set s1 impinges on microdot (ma+2$\Delta$m), wherein set s2 impinges on microdot ma and wherein set s3 impinges on microdot (ma+$\Delta$m) also is included within the scope of protection sought for by the present application.

FIG. 8.2 illustrates a recording according to the present invention using at a moment in time (ta) at least two sets, e.g. three sets (s1–s3) of available radiation beams, each set impinging on a same microdot (m1) of different scanlines (11 to 13).

FIGS. 9.1 to 11.7 illustrate for some neighbouring microdots on a same scanline the consecutive impingement of a set of radiation beams according to the present invention, corresponding intensity (energy) distribution curves, and corresponding temperature evolutions in the thermo-sensitive imaging elements.

Before studying FIGS. 9 to 11, one has to keep in mind that, for sake of clarity and simplicity, two premises were taken explicitly. However, these simplifications are not intended to restrict the conceptual scope of protection for the instant application. First, at every moment in time (ta, ta+$\Delta$t, ta+2$\Delta$t . . . ) and at every microdot (ma, ma+$\Delta$m, ma+2$\Delta$m . . . ) spot-sizes of individual radiation beams are thought to be equal.

Hence, $$\phi(bi)=\phi(bj)=\phi(bk)=\phi(bl). \qquad [2]$$

Second, at every moment in time (ta, ta+$\Delta$t, ta+2$\Delta$t . . . ) and at every microdot (ma, ma+$\Delta$m, ma+2$\Delta$m . . . ) intensities of individual radiation beams are thought to be equal in FIGS. 9 and 10.

This can be expressed symbolically by:

$$I(bi)=I(bj)=I(bk)=I(bl) \qquad [3]$$

For FIG. 11, the following is true:

$$I(b'i)=I(bi,ma+\Delta m)<I(bi,ma)=I(bj)=I(bk)=I(bl) \qquad [4]$$

By consequence of both explicit premises, in case of FIGS. 9 and 10, even a third premise is implicitly incorporated. This premise states that, for every individual radiation beam, no intensity modulation nor area modulation or spotsize modulation takes place.

Hence, $$\phi(bi; ta)=\phi(bi; ta+\Delta t)= \qquad [5]$$

and $$I(bi; ta)=I(bi; ta+\Delta t)= \qquad [6]$$

With reference to FIG. 9, now a method according to the present invention will be explained in more depth. In FIGS. 9.1 and 9.5 is illustrated how, in order to attain a recorded image, at time ta, in microdot ma on line 1a, three laser beams bj–bl impinge on a microdot ma with an energy to heat the imaging element from a steadystate temperature equal to the temperature of the ambient (abbreviated on the temperature-scale in the drawing as "amb") to a temperature T lower than a threshold temperature Tt; so, the thermo-sensitive imaging element does not produce a lithographic effective change.

After some time Δt (see FIGS. 9.2, 9.4 and 9.5), another laser beam bi reaches the same microdot ma and heats the thermo-sensitive imaging element (whose temperature had dropped in the meantime) up to a temperature substantially higher than the aforementioned threshold-temperature Tt.

So, the temperature of the imaging element may augment gradually within the available REL-time. As an example, but definitely non restrictive, after a second time-span 2Δt, no further laser beams impinge on same microdot ma (see FIGS. 9.3 and 9.5).

The incremental time difference ("period") Δt is defined by (Δm: $v_f$) wherein Δm is the distance between two successive microdots on the imaging element and $V_f$ is the scan-speed of the radiation beams in the fast-scan or main-scan direction (X). Hence, $$\Delta t=\Delta m: V_f \qquad [7]$$

With reference to FIG. 10, at microdot ma, the situations illustrated by FIGS. 10.1, 10.2 and 10.5 approach those illustrated by (the already described) FIGS. 9.1, 9.2 and 9.5 very nearly, so that hereabout no further explanation has to be recapitulated. As to microdot (ma+Δm), now another situation of a method according to the present invention, will be explained in great depth.

In FIGS. 10.2 and 10.6 is illustrated how, at time (ta+Δt), in microdot (ma+Δm) on same line 1a, two laser beams bj–bl (as available radiation beam bk is not active at this moment) impinge on said microdot with an energy to heat the imaging element to a temperature lower than a threshold temperature Tt; so, the thermo-sensitive imaging element does not produce a lithographic effective change.

After some additional time Δt, referring to moment (ta+2Δt) _(see FIGS. 10.3 and 10.6)_, a supplemental laser beam bi reaches the same microdot (ma+Δm) and heats the thermo-sensitive imaging element (whose temperature had dropped in the meantime) up to a temperature still being substantially lower than the aforementioned threshold-temperature Tt. So, although the temperature of the imaging element augments gradually within the available REL-time, in microdot ma a lithographic effective change will be perceived (cfr. FIG. 10.5), whereas in neighbouring microdot (ma+Δm) no lithographic change will be perceived (cfr. FIG. 10.6).

It is self-speaking that for further moments in time (as e.g. ta+3Δt) and for further microdots (as e.g. ma+2Δm) a same reasoning could be developed.

Apart from the indicated premises, FIGS. 9 and 10 (and also next FIG. 11) illustrate a method according to the present invention, wherein a number n of effective beams (b1 to bn) within a set (s) impinging on a particular microdot is varied. Such varying of a number of effective radiation beams strictly does not relate to the tonal resolution of the system, as the present application relates to thermo-sensitive imaging elements showing a so-called "threshold-characteristic" wherein a contone value is reproduced by a geometric distribution of binary halftone dots. Instead, such varying of a number of effective radiation beams relates to the prevention of unwanted side-reactions when making a lithographic printing plate at increased recording powers and speeds. Herein, the maximum number of effective radiation beams is equal to the preferably fixed number of available radiation beams, and the minimum number of effective radiation beams may be zero (e.g. in case of a non-effective microdot; cfr. beam bo in FIG. 7.4 which has been explained before).

For a practical illustration, one could presume a binary device comprising e.g. eight available radiation beams, each with a same (individual) power, wherein exposing by e.g. five or less radiation beams does not result in a lithographic effective change on the printing plate), and wherein six or more radiation beams provide the desired lithographic effective change (intended for a desired density on the ultimate end-product). In this non-limitative example, exposing by six radiation beams, called "effective radiation beams", gives a desired result. Exposing by seven or eight radiation beams would not change the density substantially, but it could be hazardous by causing unwanted side-reactions.

Concerning FIGS. 11.1–11.7, a typical differentiation illustrates a further preferred embodiment of a method according to the present invention. In former FIGS. 10.1–10.5 the intensities of the individual radiation beams were all equal at every moment in time, illustrating a method wherein the number n of effective beams (b1 to bn) within a set (s) impinging on a particular microdot is varied. In actual FIGS. 11.1–11.7 the intensities of the individual radiation beams are not equal at different moments in time.

In order to keep the drawings still as clear as possible, in microdot ma on scanline 1a, all effective radiation beams (bi–bl) have a same and constant intensity, which may be expressed mathematically by [I(bi)=I(bj)=I(bk)=I(bl); cfr. formula 3]. By doing so, the resulting temperature evolution in FIG. 11.6 is identical to that of a former embodiment illustrated in FIGS. 9.5. or 10.5.

Yet, in microdot (ma+Δm) on scanline 1a, all effective radiation beams except bi still have a same intensity, more particularly the intensity they have at every other moment in time (here ta+Δt; or ta+2Δt), but the intensity of bi is different in microdot ma versus microdot ma+Δa (cfr. formula 4). As a consequence, the resulting temperature evolution in FIG. 11.7 does not result in a lithographic effective change.

The present application thus seeks protection as well for a method wherein at least one of said radiation beams is unmodulated, as well as for a method, wherein an instant intensity of at least one of said radiation beams is modulated.

In general, a method for generating a screened reproduction of a contone image according to the present invention comprising the steps of: (1) screening said contone image to obtain screened data representative for tones of said contone image, and suitable for driving exposure of microdots on a radiation sensitive (or thermo-sensitive) imaging element; (2) exposing said miicrodots according to said screened data by at least one set or plurality s of radiation beams b, wherein at a point in time (ta) during said exposure, at least two radiation beams (bi,bj) of one of said sets (p) of radiation beams impinge on a different microdot (mi,mj) of a scanline 1, so that after exposure each effective microdot (which is a microdot corresponding to a lithographic effective change) of said scanline has been impinged by all effective radiation beams (which are radiation beams needed to obtain a lithographic effective change, or intended for a density different to zero) of said scanline has been impinged by all radiation beams of said set.

Now, in a preferred embodiment according to the present invention, a method for generating on a lithographic printing plate a screened reproduction of a contone image, comprises the steps of: (1) transporting a thermo-sensitive imaging element through an exposure area; (2) scanwise exposing said thermo-sensitive imaging element according to screened data representative for tones of a contone image with a set (s) of radiation beams (b) as said thermo-sensitive imaging element is transported through said exposure area, characterised in that at any given moment (ta) during said exposure at least two radiation beams (bi,bj) of said set (s) of radiation beams impinge on different microdots (mi,mj) of a scanline (1a) on said imaging element, so that by completion of the exposure step each effective microdot (which is a microdot corresponding to a lithographic effective change) of said scanline has been impinged by all effective radiation beams (which are radiation beams needed to obtain a lithographic effective change) of said set.

In a further preferred embodiment of a method according to the present invention, a time interval $\Delta t$ between an impingement of said two radiation beams ($b_i$, $b_j$) of said set (s) on a same microdot of a scanline (1a) is short enough in order to prevent a substantial cooling of an image forming layer at said microdot, and long enough in order to prevent unwanted side-reactions in said image forming layer at said microdot.

The time limits of said succession (or consecutivity) have to be defined in comparison with the thermal time-constant of the thermo-sensitive material. An upper bound should be not too large, otherwise no sufficient accumulation of heat would occur (merely because a foregoing heat has already disappeared). An under bound should be not too low, otherwise unwanted side-reactions (as e.g. local ablation and local burning) still would occur.

In a thus preferred embodiment according to the present invention, each microdot is scanned and heated several times with consecutive laser beams, wherein a time interval between two consecutive recordings (or scannings) of the same microdot is shorter than a cooling time of the imaging element resulting from thermal inertia of the imaging element.

Thus, each beam impinges consecutively in a specific time-sequence, based on a time constant of thermal diffusion of the thermo-sensitive imaging element, more particularly within a time interval which is shorter than the cooling time.

In a further preferred method according to the present invention, at least two of said radiation beams b have a mutual different wavelength, e.g. 830 nm for a laser-diode, 1064 nm for a Nd-YAG-laser, or 1053 nm for an Nd-YLF-laser.

In a further preferred embodiment, at least two of said radiation beams have a different spot-size $\psi$ in the image plane. This may be carried out by hardware (i.c. optics) in that a source of radiation comprises two different sized exposing radiation beams.

In still another preferred embodiment of a method according to the present invention, at least two of said radiation beams have a mutually different power.

As an illustration, consider an imaging element to be exposed with P (mW) of total power. This can be done by exposing once with P (mW), twice with about P/2 (mW), three times with about P/3 (mW), etc.

In a further embodiment of a method according to the present invention, at least one of said radiation beams is unmodulated. This method thus further comprises a step of preheating lines scanned by the laser beam with an infrared light beam along a total length of a respective scanline.

In a further embodiment of a method according to the present invention, the instant intensity of at least one of said radiation beams is modulated in accordance with the image content (comprising e.g. a percentage coverage). Hereto, techniques as described in e.g. EP-A 95.200.711.0 may be used.

According to the present invention, it is highly preferred that a foregoing step comprises a screening of said contone image to obtain screened data representative for tones of said contone image, and suitable for driving exposure of microdots on said thermo-sensitive imaging element.

Preferably, said exposing of said microdots is carried out according to said screened data.

(iv) Preferred embodiments for thermo-sensitive imaging elements suitable for use in a method according to the present invention In a preferred embodiment, said thermo-sensitive imaging element comprises on a hydrophillic surface of a lithographic base an image forming layer comprising hydrophobic thermoplastic polymer particles (preferably dispersed in an aqueous or alkali soluble or swellable resin) and a compound capable of converting light into heat, said compound being present in said image forming layer or a layer adjacent thereto. In this embodiment, the lithographic effective change of the imaging element relies on a difference in physical insolubilisation.

In another embodiment, said thermo-sensitive imaging element comprises on a hydrophillic surface of a lithographic base an image forming layer comprising (1) an alkali soluble or swellable resin (preferably being water insoluble) having a phenolic hydroxy group, (2) a latent Bronsted acid, (3) a cross-linking agent capable of reacting with the water insoluble, alkali soluble or swellable resin under the influence of an acid, and (4) a compound capable of converting light into heat. In this embodiment, the lithographic effective change of the imaging element upon recording and processing relies on a difference in chemical insolubilisation.

In still another embodiment, said thermo-sensitive imaging element comprises on a hydrophillic surface of a lithographic base an image forming layer comprising (1) a disperse phase comprising a hydrophobic, water-insoluble heat softenable component A, (2) a binder or continuous phase consisting of a component B which is soluble or swellable in water or alkali, at least one of the components A and B including a reactive grouping or precursor thereof, so that insolubilisation of the layer occurs at elevated temperature and/or on exposure to actinic radiation, and (3) a substance capable of strongly absorbing radiation and transferring the energy thus obtained as heat to the image forming layer, said substance being present in said image forming layer or a layer adjacent thereto.

According to one embodiment of the present invention, the lithographic base can be an anodised aluminium. A particularly preferred lithographic base is an electrochemically grained and anodised aluminium support.

According to another embodiment in connection with the present invention, the lithographic base comprises a flexible support, as e.g. paper or plastic film, provided with a cross-linked hydrophillic layer.

As flexible support of a lithographic base in connection with the present embodiment it is particularly preferred to use a plastic film e.g. substrated polyethylene terephthalate film, cellulose acetate film, polystyrene film, polycarbonate film etc. The plastic film support may be opaque or transparent.

In a further preferred embodiment of a method according to the present invention, preferably a developing step is carried out with an aqueous, including plain water, or alkaline developing solution in order to remove the unexposed areas and thereby to form a lithographic printing plate.

In order to give an overview of a commercial combination of exposure and developing steps, reference is made to FIG. 1 which illustrates an exemplary imagesetting-apparatus (also called "imagesetter" if applied to imaging elements of paper or film; or called "platesetters" if applied to printing plate precursors) suitable for carrying out a process according to the present invention. The system includes an exposing part 60 and a processing part 90, disposed side by side and interconnected by a bridging part 85. Specifically, in the exposing part 60 an imaging element 5, e.g. a thermo-sensitive imaging element is positioned at an exposure stage. The material 5 thus exposed with the image is fed to the processing part 90. The thermo-sensitive material thus developed in the processing part 90 is then ejected to an outlet.

It has to be remarked that the thermo-sensitive imaging element disclosed in the present application may be in the form of a roll, _e.g. if the lithographic base comprises a flexible support_, or (as it is more usual) it may be in the form of sheets (e.g. if the lithographic base comprises an aluminium support).

Also to be remarked, is the fact that some kinds of thermo-sensitive materials do not need a further processing, or at least not an immediate processing by passing through processing fluids. For example, in EP-A-95.202.874.4 a method is disclosed for developing imaging elements as suitable in the present application, which is carried out on a rotating print cylinder of a printing press.

(v) Further applications of the present invention

The invention relates to a method wherein a lithographic printing plate precursor is scanwise exposed and optionally developed according to a thermal recording process. Preferably, the exposure is carried out directly on the printing plate precursor and the exposure and the developing are combined within one apparatus or platesetter. This combination refers to a so-called "computer-to-plate" system (often abbreviated as CTP).

Herein, it may be clear to people skilled in the art that computer-to-plate imaging includes as well printing plate precursors on an aluminium base as well as on a polyester base.

It also has to be underscored that in some mentioned embodiments, no chemical processing is necessary after the exposure. That's why in some of the drawings (e.g. FIG. 3) explicitly no chemical processing has been indicated, in opposite to some other drawings (as e.g. FIG. 1).

As to the scanwise exposure of the imaging elements, it may be repeated that the present invention is not restricted to a strictly consecutive impinging of radiation beams on immediate neighbouring microdots on a same scanline. For example, it has already been indicated, with former reference to FIGS. 7 to 11, that optionally also non-immediate neighbouring microdots, also called further neighbouring microdots, might be exposed successively. In the future, as the attainable recording speeds may increase considerably, the distance between successive impingements of radiation beams also may enlarge.

However, an extremis embodied by a hypothetical sequence of radiation beams impinging totally at random, has to be excluded. Indeed, a time interval between an impingement of two radiation beams on a same microdot of a scanline always has to be short enough in order to prevent a substantial cooling of an image forming layer at said microdot. A time interval between two consecutive recordings (or scannings) of the same microdot has to be shorter than a cooling time of the imaging element resulting from thermal diffusion or thermal inertia of the imaging element. Otherwise no sufficient accumulation of heat would occur.

As to the exposure source of the imaging elements, instead of laser beams, other kinds of infrared-type radiation beams might be used. For example, any coherent, highly focused or narrow width radiation source which has fast response characteristics in order to be suitable for modulation techniques.

A scanwise exposure according to the present invention mainly comprises a linewise and pixelwise progressing movement (also called "sweeping") of an exposure spot, originating e.g. from a laser-source and deflected f.e. by a moving mirror, a rotating prism, a galvanometer etc., in order to pixelwise heat the imaging element.

The present application preferably can be applied to most kinds of thermo-sensitive imaging elements, thermo-sensitive imaging elements, especially to those thermo-sensitive imaging elements which show a so-called "threshold-characteristic".

Further preferred heat mode imaging elements show so-called "direct read after write"—characteristics (DRAW). They have been disclosed in e.g. EP-A-0 384 041 and in EP-A-96.201.082.3 (both of Agfa-Gevaert N. V.). Generally, relatively low melting metals such as bismuth have been introduced in the production of a heat-mode recording layer of this kind. By exposing such a recording element very shortly by pulses of a high-power laser the radiation is converted into heat on striking the bismuth layer surface. As a result the writing spot ablates or melts a small amount of the bismuth layer. On melting the layer contracts on the heated spot by surface tension thus forming small cavitations or holes. As a result light can pass through these cavitations and the density is lowered to a certain minimum value depending on the laser energy irradiated.

Commercially available DRAW-materials are e.g. known under the tradename MASTERTOOL™ (Agfa-mevaert N. V.).

When further increasing the recording power (e.g. for attaining an increased fast-scan-speed), unwanted side-reactions occur, as e.g. unwanted colouring. This can be solved by carrying out a method according to the present invention.

Still another type of heat mode imaging elements comprises formation of heat mode images based on the reduction of organic metal salts, preferably silver salts such as silver behenate, without the presence of catalytic amounts of exposed silver halide. Such heat mode imaging element comprises a layer containing a reducing agent, a barrier layer, and a layer containing a reducible organic metal salt, preferably silver behenate. The barrier layer is destructible by laser radiation and allows transfer of reducing agent in the exposed parts while no such transfer occurs in the unexposed parts. Preferably, an overall heat post-treatment is given.

A mono-sheet and a two-sheet version are described both in EP-A-96.202.650 (Agfa-Gevaert N. V.). When further increasing the recording power (e.g in order to attain an increased fast-scan-speed), unwanted side-reactions occur, as e.g. unwanted ablation. Therefor, it may be advantageous to apply the method of the instant invention also on this type of imaging elements.

While further modifications will become possible for those skilled in the art after receiving the teachings of the present disclosure, certain changes and modifications still can be made without departing from the spirit and scope of the invention as defined by the following claims.

We claim:

1. A method for generating on a lithographic printing plate a screened reproduction of a contone image, comprising the steps of:
    (1) transporting a thermo-sensitive imaging element through an exposure area, the imaging element having thereon at least one scan line including a plurality of microdots, at least one microdot being an effective microdot;
    (2) scanwise exposing said thermo-sensitive imaging element according to screened data representative for tones of a contone image with a set of radiation beams as said thermo-sensitive imaging element is transported through said exposure area, at least one of said radiation beams being an effective radiation beam, at any given moment during said exposure at least two radiation beams of said set of radiation beam impinge on different microdots of a scanline on said imaging element, so that by completion of the exposure step each effective microdot of said scanline has been impinged by all effective radiation beams of said set, wherein said thermo-sensitive imaging element includes an image forming layer on a hydrophillic surface of a lithographic base, said image forming layer comprising hydrophobic thermoplastic polymer particles and a compound capable of converting light into heat, said compound being present in one of said image forming layer and a layer adjacent thereto.

2. A method according to claim 1, wherein a time interval Δt between an impingement of one of said at least two radiation beams of said set and an impingement of another one of said at least two radiation beams of said set on a same microdot of a scanline is short enough in order to prevent a substantial cooling of an image forming layer at said microdot, and long enough in order to prevent unwanted side-reactions in said image forming layer at said microdot.

3. A method according to claim 1 or 2, wherein the method includes before step (1) the step of screening said contone image to obtain said screened data suitable for driving exposure of microdots on said thermo-sensitive imaging element.

4. A method according to claim 1, wherein said thermo-sensitive imaging element comprises on a hydrophillic surface of a lithographic base an image forming layer comprising (1) an alkali soluble or swellable resin having a phenolic hydroxy group, (2) a latent Bronsted acid, (3) a cross-linking agent capable of reacting with the water insoluble, alkali soluble or swellable resin under the influence of an acid, and (4) a compound capable of converting light into heat.

5. A method according to claim 1, wherein said thermo-sensitive imaging element comprises on a hydrophillic surface of a lithographic base an image forming layer comprising (1) a disperse phase comprising a hydrophobic, water-insoluble heat softenable component A, (2) a binder or continuous phase consisting of a component B which is soluble or swellable in water or alkali, at least one of the components A and B including a reactive grouping, such that insolubilisation of the layer occurs at elevated temperature and/or on exposure to actinic radiation, and (3) a substance capable of absorbing radiation and transferring the energy thus obtained as heat to the image forming layer, said substance being present in said image forming layer or a layer adjacent thereto.

6. A method according to any of the claims 1, 4 or 5, wherein the exposure step is followed by a development with an aqueous or alkaline developing solution, including plain water, in order to remove the unexposed areas and thereby to form a lithographic printing plate.

7. A method according to claim 1, wherein during said exposure step the number of effective beams within a set of radiation beams impinging on a particular microdot is varied.

8. A method according to claim 1, wherein at least one of said radiation beams is unmodulated.

9. A method according to claim 1, wherein an instant intensity of at least one of said radiation beams is modulated.

* * * * *